United States Patent [19]
Park

[11] Patent Number: 6,166,447
[45] Date of Patent: Dec. 26, 2000

[54] SEMICONDUCTOR MEMORY DEVICE HAVING FIRST AND SECOND VOLTAGE LEVEL SHIFTERS

[75] Inventor: Sung Kye Park, Chungcheongbuk-do, Rep. of Korea

[73] Assignee: Hyundai Electronics Industries Co., Ltd., Ichon-shi, Rep. of Korea

[21] Appl. No.: 08/932,378

[22] Filed: Sep. 17, 1997

[30] Foreign Application Priority Data

Apr. 15, 1997 [KR] Rep. of Korea ...................... 97-13819

[51] Int. Cl.[7] ...................................................... H01L 27/11
[52] U.S. Cl. ........................... 257/903; 257/904; 257/379
[58] Field of Search ................................. 257/66, 67, 69, 257/379, 380, 381, 903, 904; 365/156, 154, 182, 190

[56] References Cited

U.S. PATENT DOCUMENTS

| 4,535,426 | 8/1985 | Ariizumi et al. | 365/182 |
| 5,508,750 | 4/1996 | Hewlett et al. | 348/558 |
| 5,831,897 | 11/1998 | Hodges | 257/903 |

*Primary Examiner*—Olik Chaudhuri
*Assistant Examiner*—Hoai Pham

*Attorney, Agent, or Firm*—Fleshner & Kim, LLP

[57] ABSTRACT

A memory device of the present invention provides a stable operation and low voltage characteristics. An access device receives first and second data signals on first and second data lines, respectively, and is coupled to first and second nodes. A drive device is coupled to the access device at the first and second nodes. A voltage shifting device is coupled to at least one of the first and second nodes to change a voltage of at least one of the first and second nodes. The access device includes a first access transistor coupled to the first data line and the first node. The access device also includes a second access transistor coupled to the second data line and the second node. The first and second access transistors are responsive to a control signal. The drive device includes a first resistive element coupled to the first node, a second resistive element coupled to the second node, a first drive transistor coupled to the first and second nodes, and a second drive transistor coupled to the first and second nodes. The voltage shifting device includes a first voltage shifter coupled to the first node such that the first voltage shifter changes a first node voltage level, and a second voltage shifter coupled to the second node such that the second voltage shifter changes a second node voltage level.

26 Claims, 11 Drawing Sheets

SEMICONDUCTOR MEMORY DEVICE HAVING FIRST AND SECOND VOLTAGE LEVEL SHIFTERS

BACKGROUND OF THE INVENTION

1. Field of the Invention

The present invention relates to a semiconductor memory device, and more particularly, to a static random access memory and a method for fabricating the same.

2. Background of the Related Art

A related art method for fabricating a semiconductor memory device will be explained with reference to the attached drawings. FIG. 1 illustrates a circuit of a general SRAM cell, and FIGS. 2a–2c illustrate sections across an access transistor TA and a drive transistor TD in an SRAM showing steps of a related art method for fabricating the SRAM.

Referring to FIG. 2a, an active region and a field region are defined on a semiconductor substrate 1, and a field insulating film 2 is formed on the field region. An oxide film is deposited on the entire surface to form a gate oxide film 3. A Buried Contact (BC) region 4 for connecting a first cell node CN1 to a gate electrode for a second drive transistor is defined, wherefrom the gate oxide film 3 is removed. As shown in FIG. 2b, $n^+$ impurity ions are injected into the semiconductor substrate 1 in the buried contact region 4 to form an $n^+$ impurity region 5 therein. A polysilicon layer is deposited on the entire surface and predetermined regions thereof are patterned to form a gate electrode 6b for the access transistor and a gate electrode 6a for the drive transistor. In this instance, the gate electrode 6a for the drive transistor is formed to be in contact with the $n^+$ impurity region 5 in the buried contact region. Portions of the semiconductor substrate 1 on both sides of the gate electrode 6b for the access transistor are lightly doped with n type impurity ions to form LDD regions 7 therein.

As shown in FIG. 2c, an oxide film is deposited on the entire surface, and etched back to form sidewall insulating films 8 at both sides of the gate electrode 6b for the access transistor and the gate electrode 6a for the drive transistor. Portions of the semiconductor substrate 1 on both sides of the gate electrode 6b for the access transistor and the gate electrode 6a for the drive transistor are heavily doped with n type impurity ions to form source/drain regions 9. An interlayer insulating film 10 is deposited on the entire surface, and portions of the gate oxide film 4 and the interlayer insulating film 10 on one side of the gate transistor 6a for the drive transistor, i.e., one side of the buried contact region 4 over the source/drain region 9 is subjected to anisotropic etching to form a contact hole therein. An undoped polysilicon layer is deposited on the entire surface and subjected to patterning to be in contact with the source/drain region 9 to form a load polysilicon layer 11.

The operation to write a value of "1" on the first cell node CN1 in the general SRAM cell will be explained with reference to FIG. 1. In general, to write a data on a cell, a word line (W/L) is applied with a voltage of 5 V to turn on a first access transistor TA1 and a second access transistor TA2. Then, the data intended to store is applied to a bit line and a bit bar line. Consequently, data on the bit line B/L and the bit bar line /B/L can be stored in the first cell node CN1 and the second cell node CN2 through the first access transistor TA1 and the second access transistor TA2, respectively. The voltage stored in the first cell node CN1 can be expressed as $V_{CN1}=V_{CC}-Vth'(TA1)$, where, Vth'(TA1) is a threshold voltage increased by a back bias effect of the first access transistor TA1. For example, when $V_{CC}$=5 V, the voltage stored in the first cell node CN1 is $V_{CN1}$=5−1.5=3.5 V.

However, the related art method for fabricating a semiconductor memory device has various problems. For example, the higher the threshold voltage of the access transistor and higher back bias voltage Vth'(TA1) cause an instable operation of the SRAM at a low voltage.

SUMMARY OF THE INVENTION

Accordingly, the present invention is directed to a semiconductor memory cell and a method for fabricating the same that substantially obviates one or more of the problems due to limitations and disadvantages of the related art.

An object of the present invention is to provide a stable operation of a memory device.

Additional features, objects and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor memory device includes a first access transistor, a second transistor, a first drive transistor, a second drive transistor, a first load resistor, a second load resistor, a first cell node having a first terminal of the first access transistor, a gate terminal of the second drive transistor and the first load resistor connected thereto in common, a second cell node having a first terminal of the second access transistor, a gate terminal of the first drive transistor and the second load resistor connected thereto in common, a first voltage shifter connected to the first cell node for changing a voltage, and a second voltage shifter connected to the second cell node for changing a voltage.

In another aspect of the present invention, there is provided a method for fabricating a semiconductor memory device, including the steps of forming gates for first, and second access transistors and gates for first, and second drive transistors on a semiconductor substrate in one direction, forming first, and second impurity regions of the first, and second access transistors, forming a gate for a first voltage shifter over the gate for the first access transistor and the gate for the first drive transistor, and forming a gate for a second voltage shifter over the gate for the second access transistor and the gate for the second drive transistor, forming first impurity regions, channel regions and second impurity regions of the first, and second voltage shifters in the second impurity regions of the first, and second access transistors, forming a first load resistor to be in contact both with the first impurity region of the first access transistor and the first impurity region of the first voltage shifter and a second load resistor to be in contact both with the first impurity region of the second access transistor and the first impurity region of the first voltage shifter, and forming a bit line to be in contact both with the second impurity region of the first access transistor and the second impurity region of the first voltage shifter and a bit bar line to be in contact both with the second impurity region of the second access transistor and the second impurity region of the second voltage shifter.

The present invention may also be achieved in whole or in part by a semiconductor memory device including two access transistors, two drive transistors and two load resistors and voltage shifters each connected to one of the access transistors for changing a voltage, the semiconductor memory device having gates for the access transistors formed on a substrate, and first, and second impurity regions of the access transistors formed in portions of the substrate on both sides of the gates of the access transistors; a first impurity region, a channel region and a second impurity region of the voltage shifters formed in portions of the substrate along the first impurity regions of the access transistors; and gates for the voltage shifters formed on the channel regions of the voltage shifters.

The present invention may be also achieved in a part or in whole by a semiconductor memory device including gates for first and second access transistors formed on a substrate; first, and second impurity regions of the first, and second access transistors formed in portions of the substrate on both sides of the gates of the first, and second access transistors; a gate for a second drive transistor formed on the substrate to be in connection with the first impurity region of the first access transistor; a gate for a first drive transistor formed on the substrate to be in connection with the first impurity region of the second access transistor; a gate for a first voltage shifter formed along the gate for the first access transistor and the gate for the first drive transistor to overlap with the first impurity region of the first access transistor to an extent; a gate for a second voltage shifter formed along the gate for the second access transistor and the gate for the second drive transistor to overlap with the first impurity region of the second access transistor to an extent; first impurity regions, channel regions and second impurity regions of the first, and second voltage shifters formed along the second impurity regions of the first, and second access transistors; a first load resistor connected to the first impurity region of the first access transistor and the gate for the second voltage shifter; and a second load resistor connected to the first impurity region of the second access transistor and the gate for the first voltage shifter.

The present invention may be also achieved in a part or in whole by a memory device including an access device that receives first and second data signals on first and second data lines, respectively, and coupled to first and second nodes; a drive device coupled to the access device at the first and second nodes; and a voltage shifting device coupled to at least one of the first and second nodes to change a voltage of at least one of the first and second nodes.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
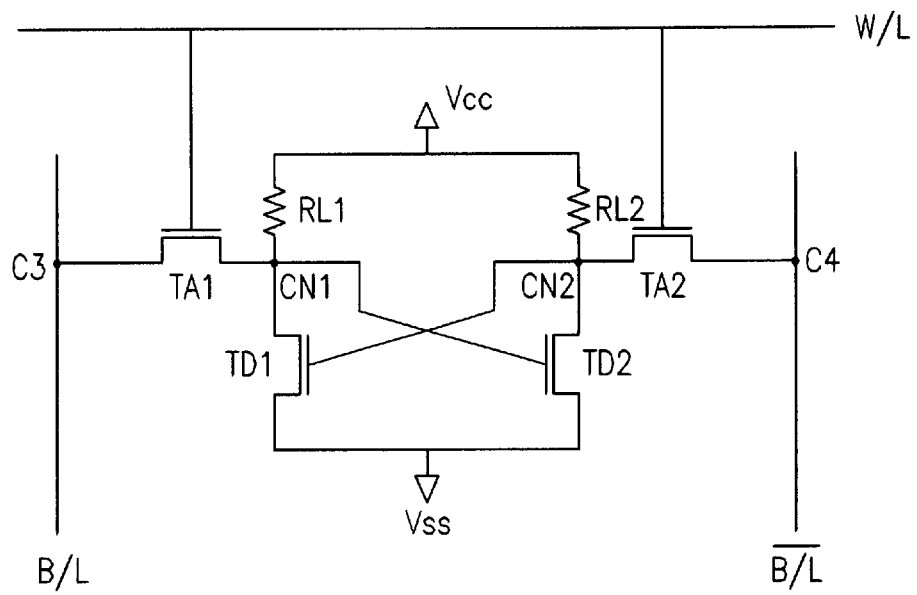
FIG. 1 illustrates a circuit of a general SRAM cell.
Figure 2A:
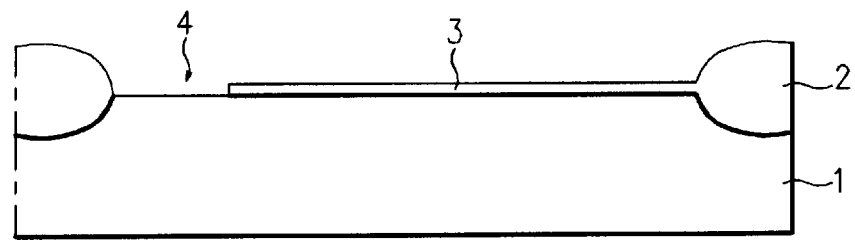
FIGS. 2a–2c illustrate sections across an access transistor and a drive transistor in an SRAM showing steps of a related method for fabricating the SRAM.
Figure 2B:
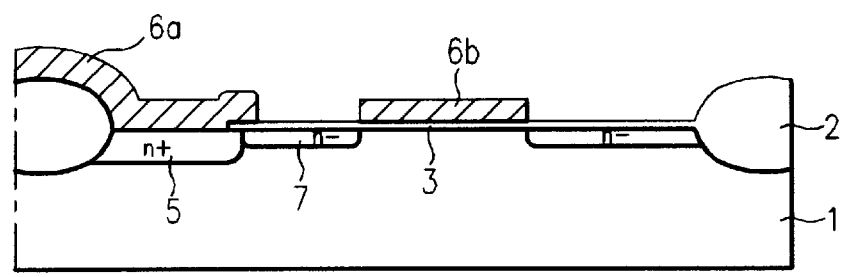
Figure 2C:
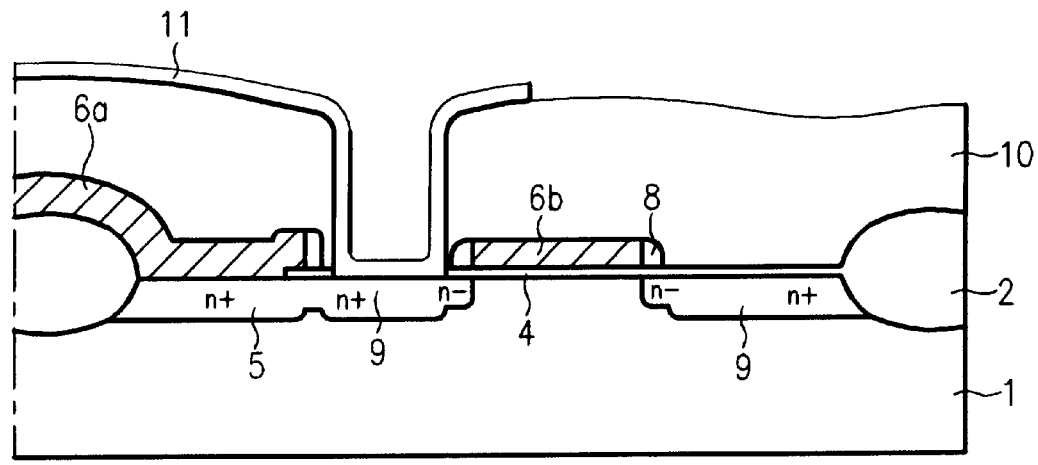
Figure 3:
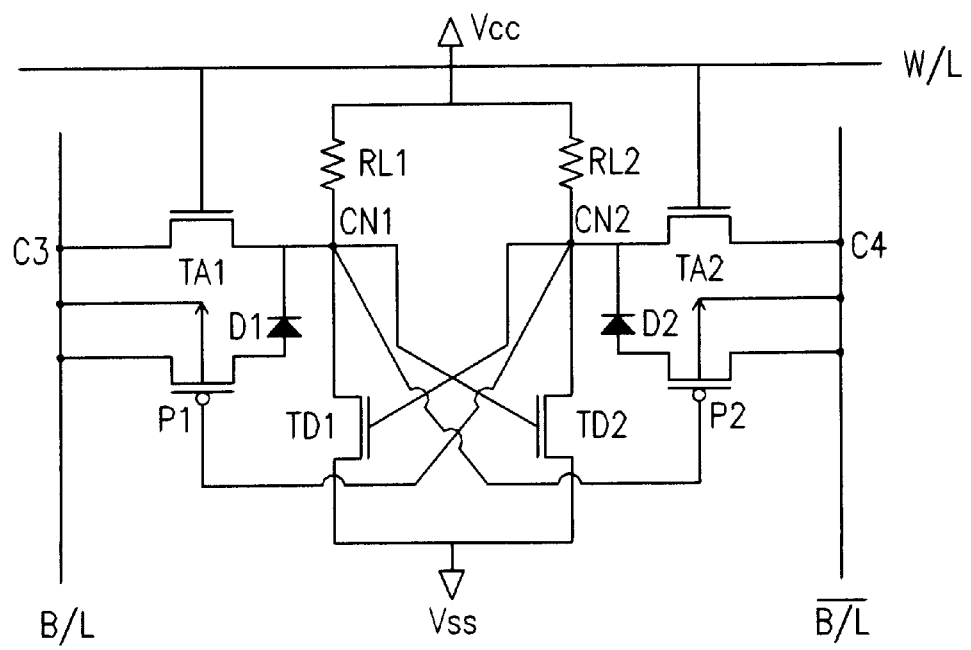
FIG. 3 illustrates a circuit of an SRAM cell in accordance with a preferred embodiment of the present invention.
Figure 4:
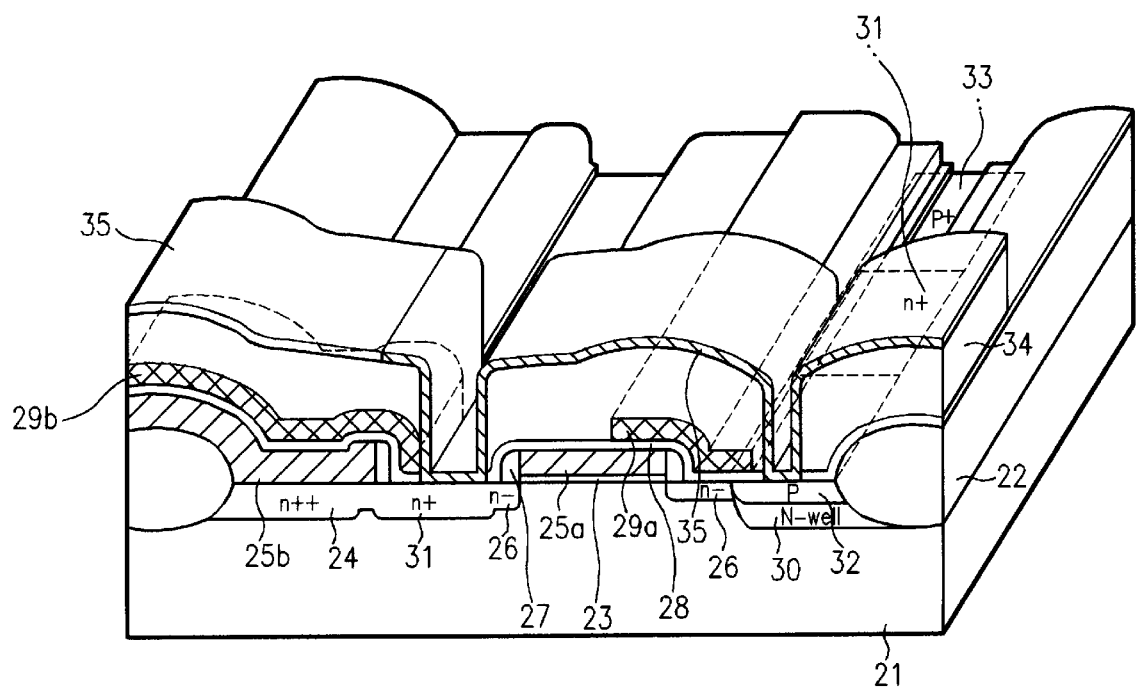
FIG. 4 illustrates a perspective view showing an access transistor and a drive transistor in an SRAM in accordance with a preferred embodiment of the present invention.

FIG. 3 illustrates a circuit of an SRAM cell in accordance with a preferred embodiment of the present invention, and FIG. 4 illustrates a perspective view showing an access transistor and a drive transistor in an SRAM in accordance with a preferred embodiment of the present invention. FIGS. 5a–5d illustrate sections showing the steps of a method for fabricating an access transistor and a drive transistor in an SRAM in accordance with a preferred embodiment of the present invention, and FIGS. 6a–6f illustrate plan views showing the steps of a method for fabricating an SRAM cell in accordance with a preferred embodiment of the present invention.

Figure 5A:
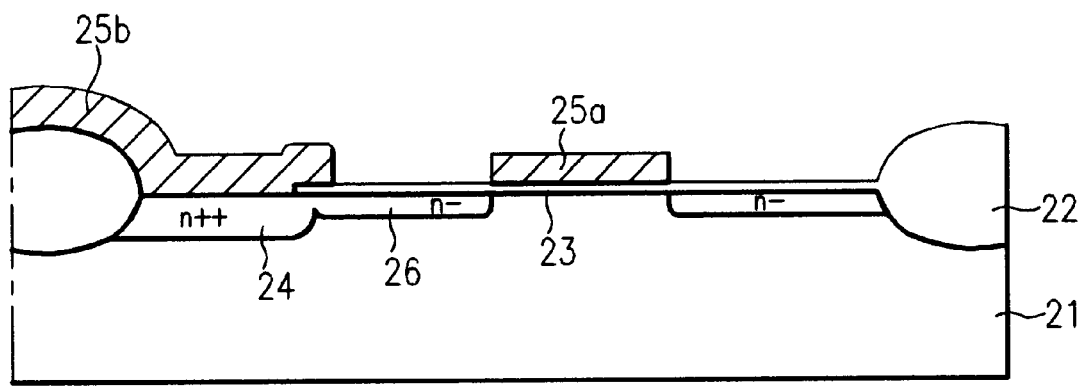
FIGS. 5a–5d illustrate sections showing the steps of a method for fabricating an access transistor and a drive transistor in an SRAM in accordance with a preferred embodiment of the present invention.
Figure 5B:
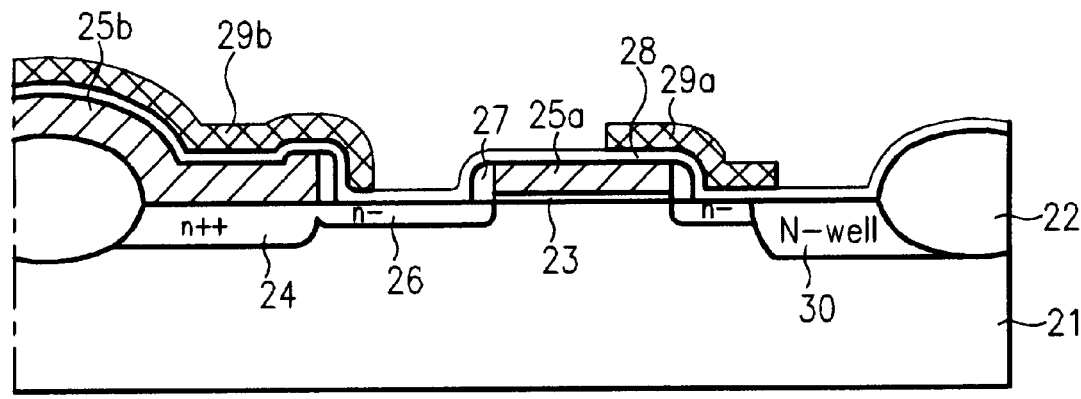
Figure 5C:
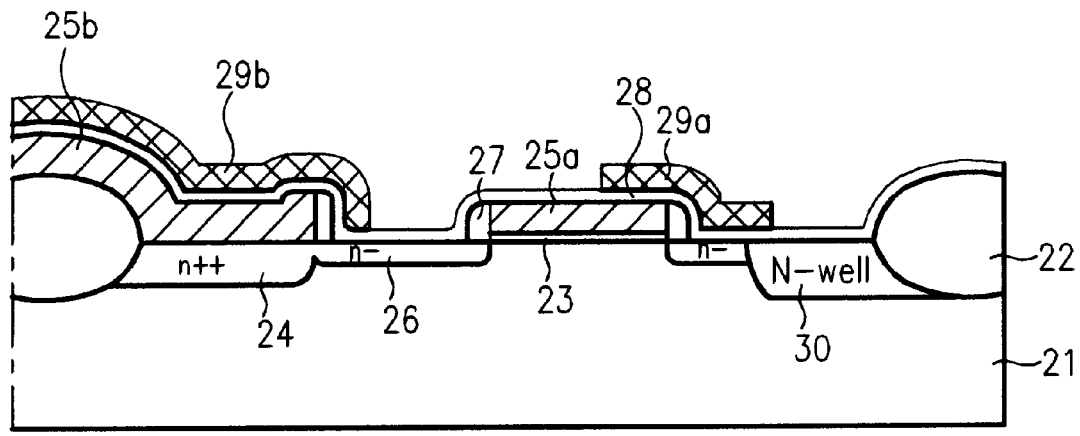
Figure 5D:
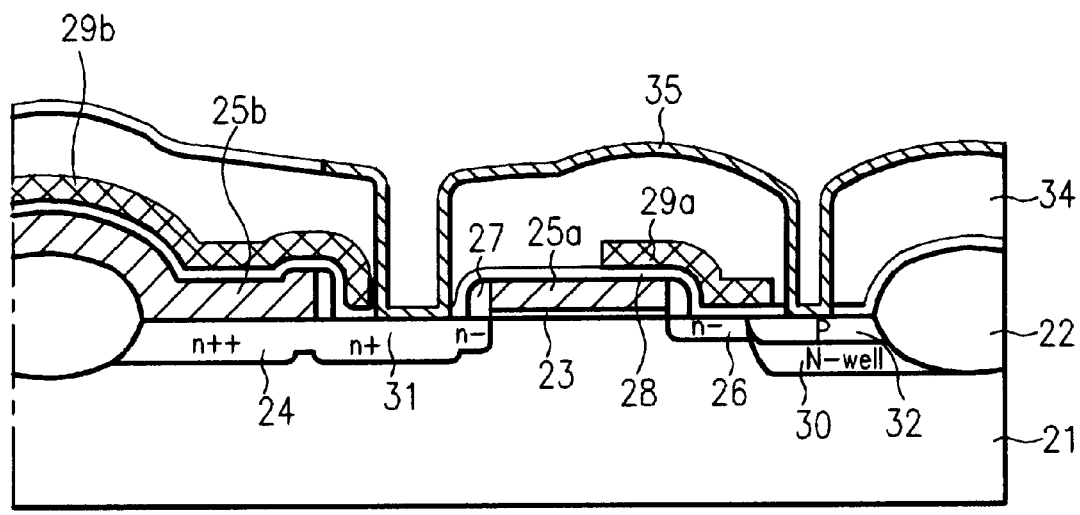
Figure 6A:
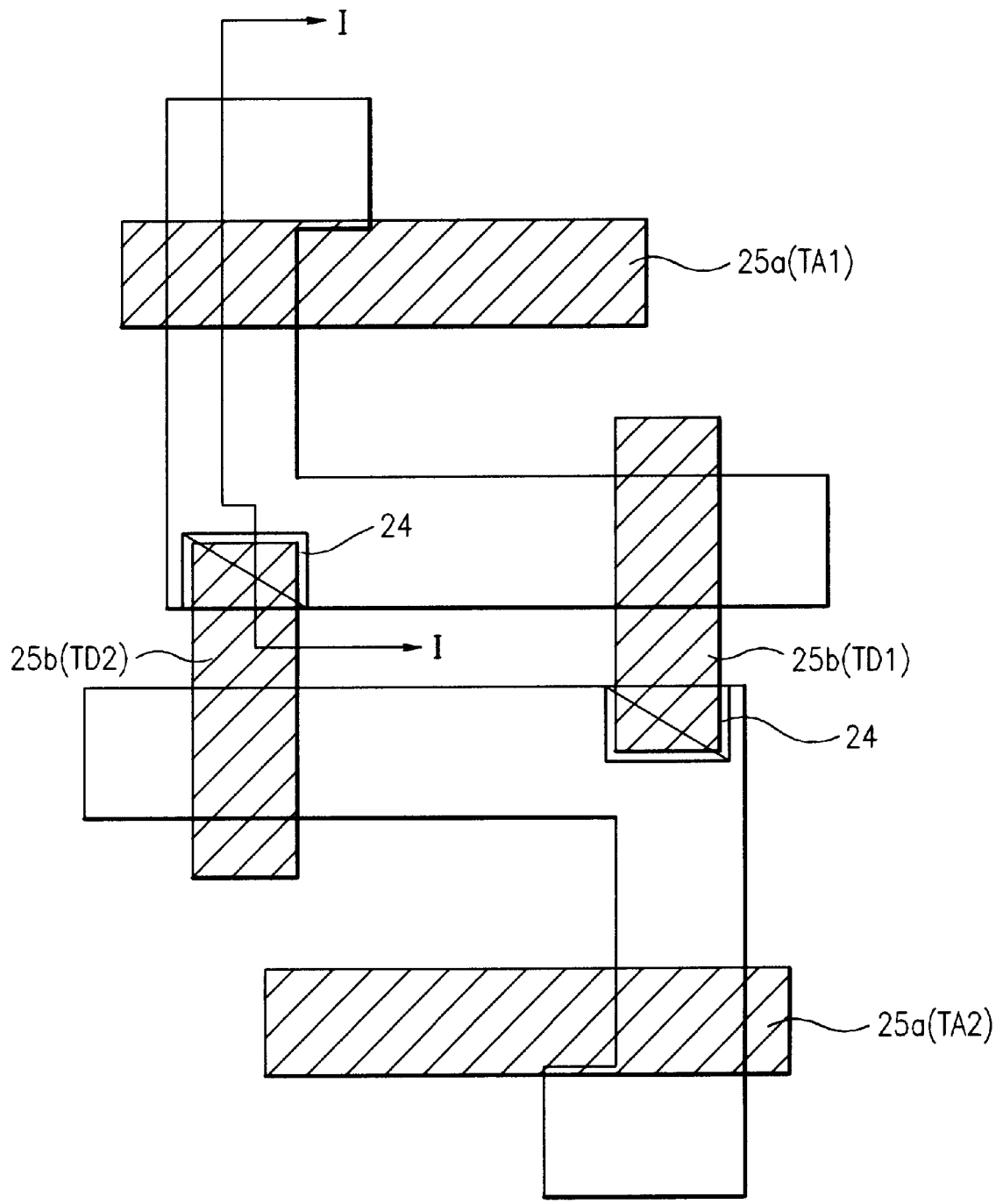
FIGS. 6a–6f illustrate plane views showing the steps of a method for fabricating an SRAM cell in accordance with a preferred embodiment of the present invention.
Figure 6B:
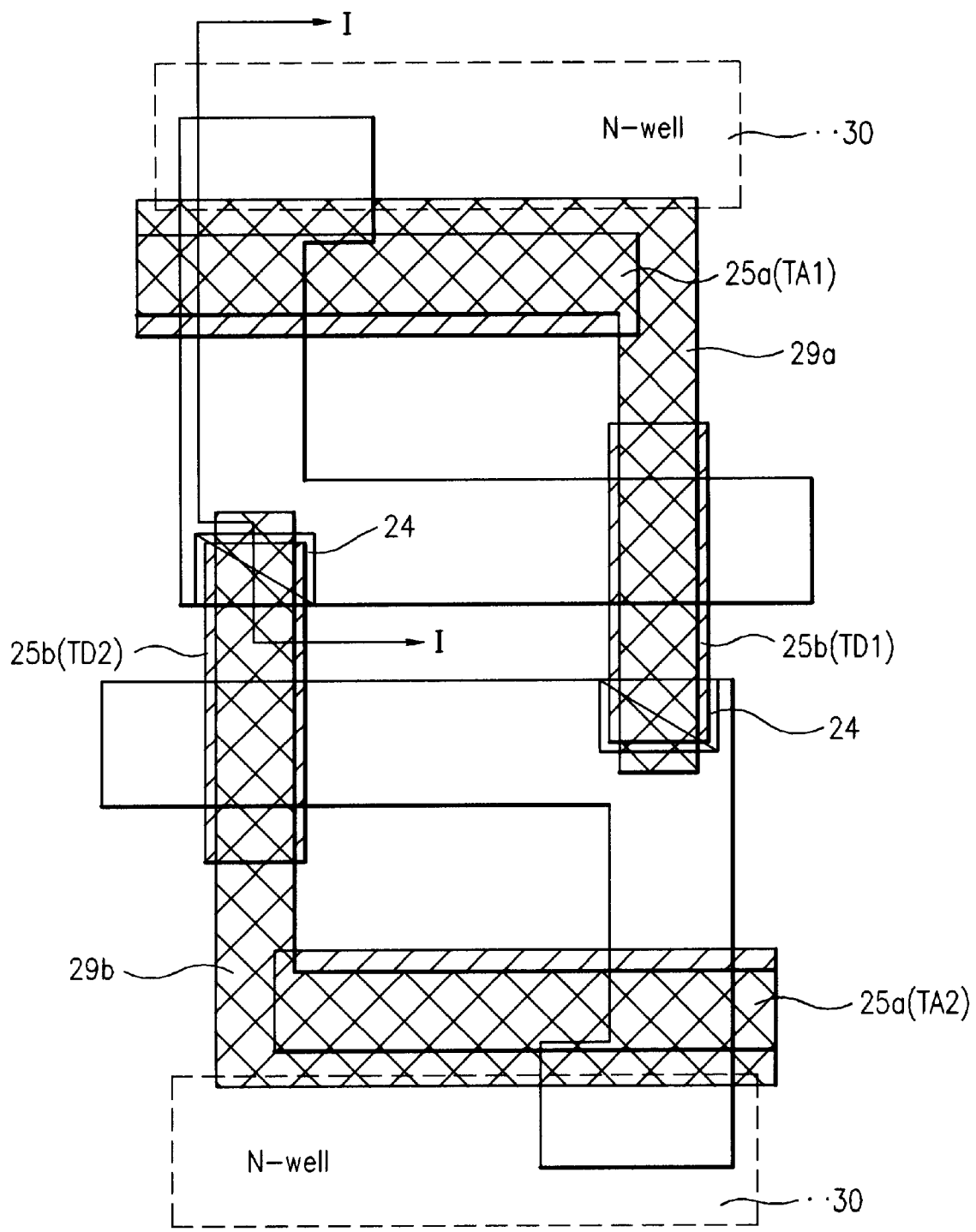
Figure 6C:
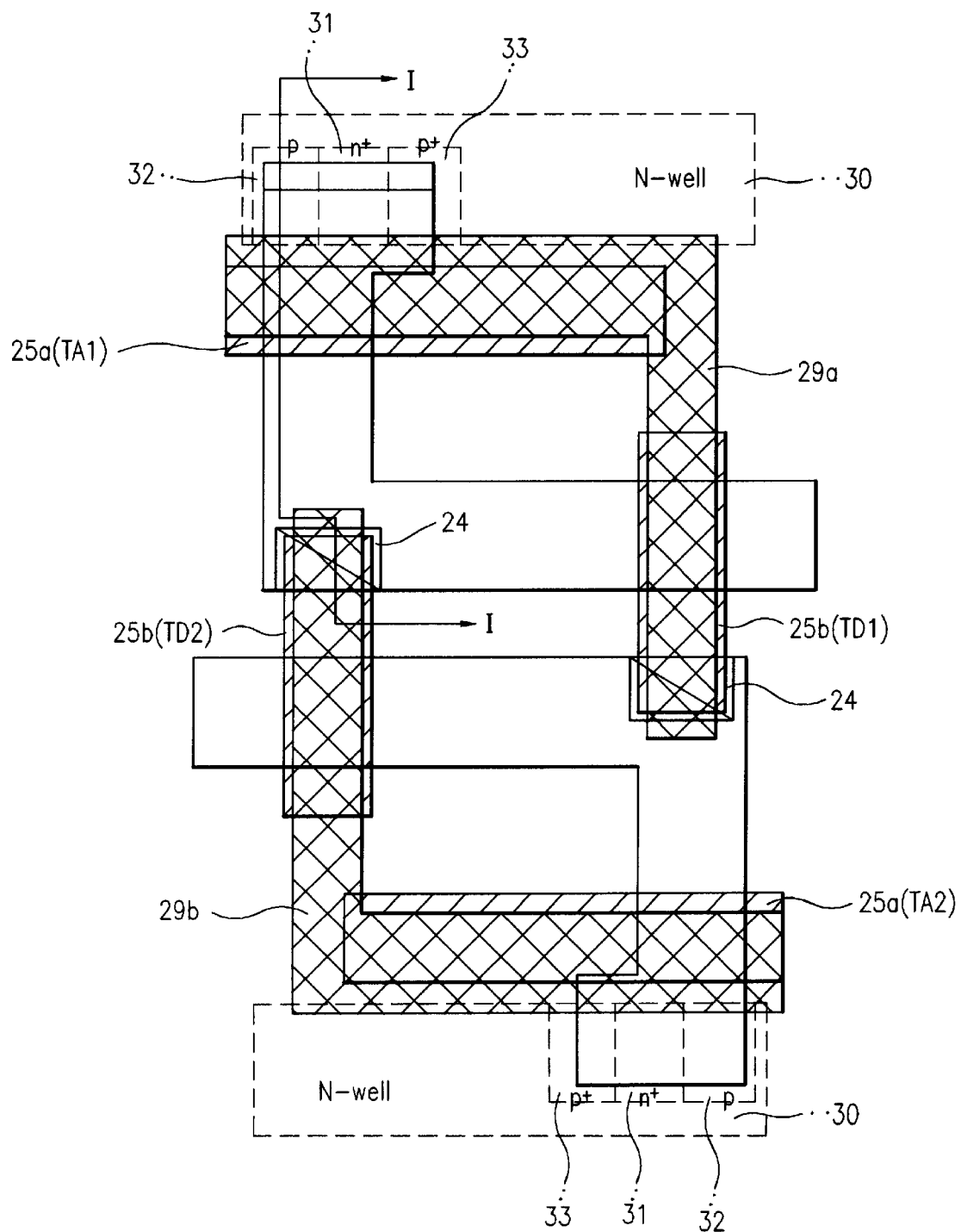
Figure 6D:
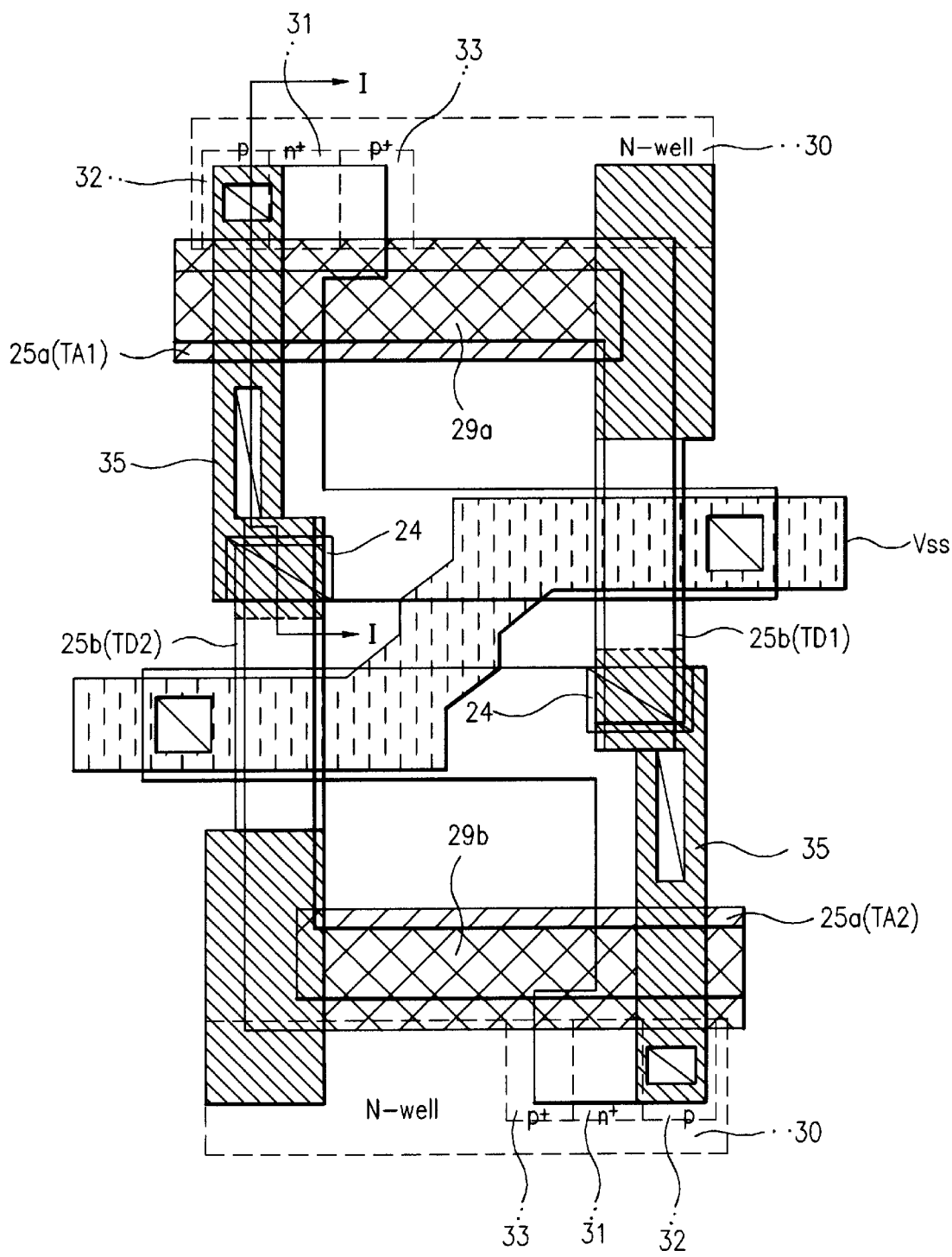
Figure 6E:
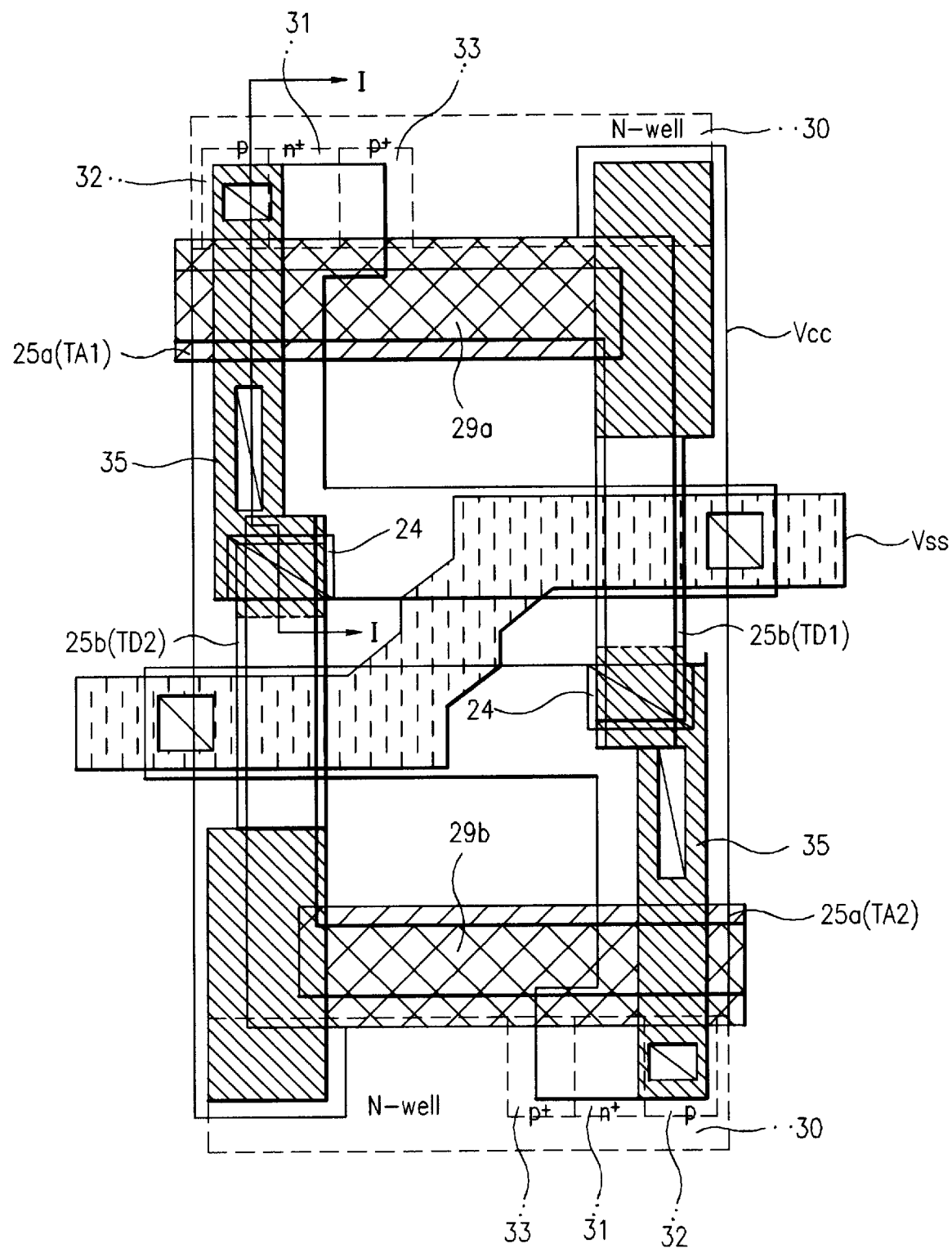
Figure 6F:
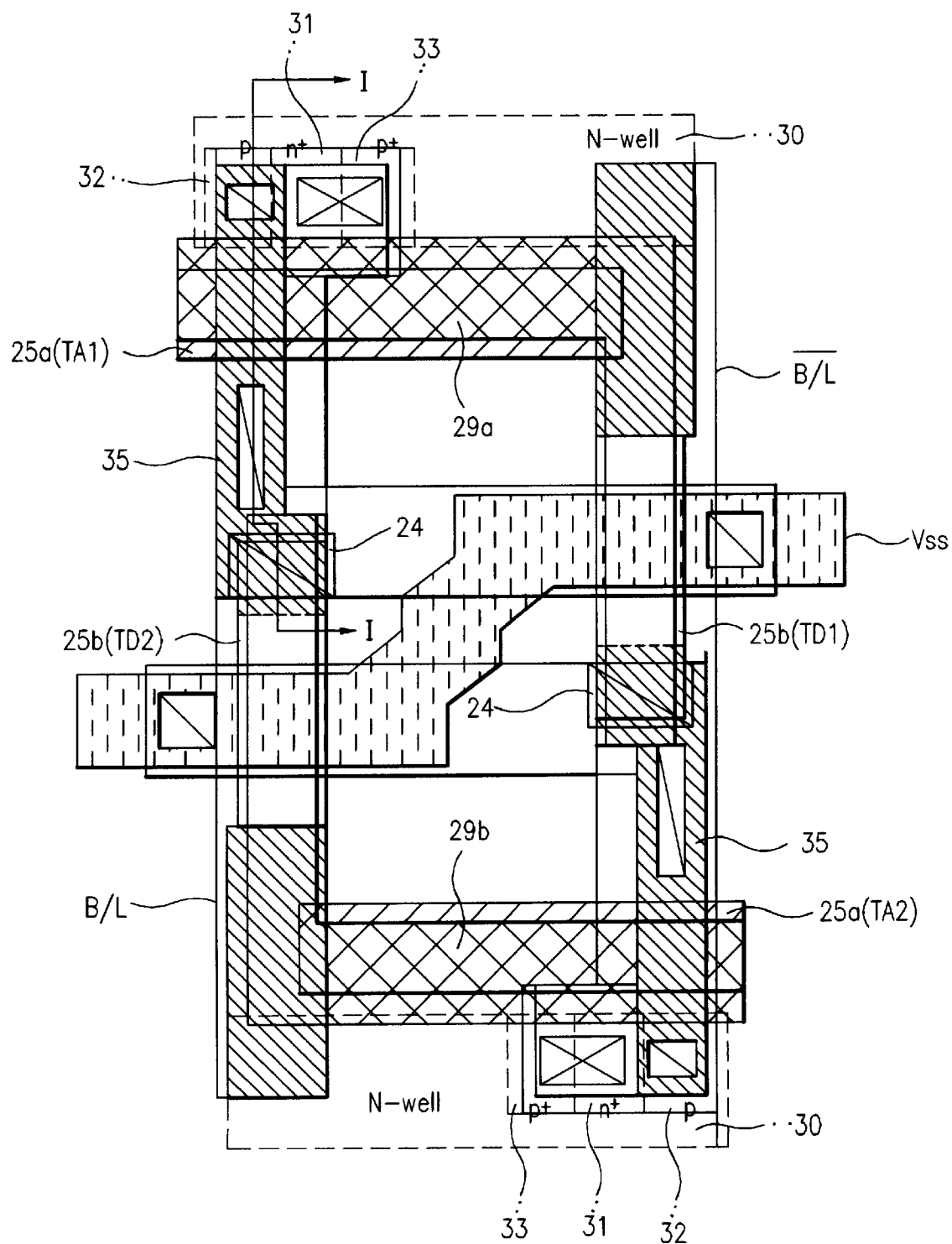

Referring to FIGS. 3, 5d and 6f, the semiconductor memory device in accordance with a preferred embodiment of the present invention includes first and second access transistors TA1 and TA2, first and second drive transistors TD1 and TD2, first and second PMOS transistors P1 and P2, first and second diodes D1 and D2 and two load resistors RL1 and RL2. The gates of the first access transistor TA1 and the second access transistor TA2 are connected to a word line W/L, a source of the first access transistor TA1 is connected to a bit line, and a source for the second access transistor TA2 is connected to a bit bar line /B/L. A gate of the second drive transistor TD2 is connected to a drain of the first access transistor TA1. A drain of the second drive transistor TD2 is connected to a drain of the second access transistor TA2, the load resistor RL2 and a gate of the first PMOS P1 at the second cell node CN2 in common. A gate of the first drive transistor TD1 is connected to a drain of the second access transistor TA2. A drain of the first drive transistor TD1 is connected to a drain of the firs t access transistor TA1, the load resistor RL1 and a gate of the second PMOS transistor P2 at the first cell node CN1 in common.

Each drain of the first drive transistor TD1 and the second drive transistor TD2 is connected to a supply voltage terminal $V_{CC}$ through the load resistor RL1 and RL2 respectively, and each source of the first drive transistor TD1 and the second drive transistor TD2 is connected to a ground voltage terminal $V_{SS}$. The first PMOS transistor P1, acting as a voltage shifter, is formed both over the gate electrodes of the first access transistor TA1 and the first drive transistor TD1, and has a gate connected to the drain of the second access transistor TA2 and a source connected to the bit line B/L. The second PMOS transistor P2, acting as a voltage shifter, has a gate connected to the drain for the first access transistor TA1 and a source connected to the bit bar line /B/L. The first diode D1, formed between the drains for the first PMOS transistor P1 and the first access transistor TA1, is configured to be an inverse PN diode with respect to the drain of the first access transistor TA1. The second diode D2 is formed between the second access transistor TA2 and the second PMOS transistor P2.

The portions of the first access transistor, the fist cell node CN1 and the second drive transistor of the aforementioned semiconductor memory device in accordance with a preferred embodiment of the present invention will be explained in more detail.

Referring to FIG. 3 and 4, a first gate oxide film 23 is formed on a semiconductor substrate 21 and a gate electrode 25a of the first access transistor TA1 is formed on the first gate oxide film 23 in one direction. An $n^{++}$ impurity region 24 is formed in a buried contact region at one side of the semiconductor substrate 21 and a gate electrode 25b of the second drive transistor TD2 is formed in contact with the $n^{++}$ impurity region 24. Sidewall insulating films 27 are formed on both sides of the gate electrode 25a of the first access transistor TA1 and the gate electrode 25b of the second drive transistor TD2. $N^-$ impurity regions 26 are formed in portions of the semiconductor substrate 21 on sides of the gate electrode 25a of the first access transistor TA1 and the gate electrode(see FIG. 6f) of the first drive transistor.

An N well 30 is formed in a portion of the semiconductor substrate 21 on one side of the gate electrode 25a of the first access transistor TA1 which is equally divided into three regions in one direction. The three regions include a p impurity region 32, an $n^+$ source/drain region 31 and a $p^+$ impurity region 33. A second gate oxide film 28 is formed on the entire surface to open both the $n^+$ source/drain region 31 and the p impurity region 32.

A first PMOS gate electrode 29a is formed to cover a side of and a top of the N well 30 one side of the gate electrode 25a of the first access transistor. The first PMOS gate electrode 29a also covers a top of the $n^-$ impurity region 26. An interlayer insulating film 34 is formed on the entire surface with a contact hole to each of the $n^+$ source/drain region 31 on one side of the gate electrode 25a of the first access transistor TA1 and the p impurity region 32 on the other side of the gate electrode 25a. A load polysilicon layer 35 is formed on the interlayer insulating film 34 to be in contact with the $n^+$ source/drain region 31 and the p impurity region 32 through the contact holes. Portions of the polysilicon layer 35 in contact with the $n^+$ source/drain region 31 and the p impurity region 32 are doped with n type impurity ions and the other portions of the polysilicon layer 35 are not doped.

A method for fabricating a semiconductor memory device in accordance with a preferred embodiment of the present invention will be described in detail. Referring to FIGS. 5a and 6a, a field region and an active region are defined on a semiconductor substrate 21 and a field insulating film 22 is formed on the field region. A first gate oxide film 23 is deposited on the entire surface and a buried contact region is defined for making a first cell node CN1 to be in contact with a gate electrode 25b of a second drive transistor TD2 of an SRAM cell, together with a buried contact region for making a gate electrode 25b for the first drive transistor to be in contact with the second cell node CN2. An n type impurity ions are heavily doped in the semiconductor substrate 21 in the buried contact region to form an $n^{++}$ impurity region 24 therein. A first polysilicon layer is deposited on the entire surface and patterned to form a gate electrode 25a for first and second access transistors and a gate electrode 25b for first and second drive transistors. The first access transistor TA1, formed of an NMOS, is formed spaced apart from and vertical to the gate electrode 25b of the second drive transistor TD2. The gate electrode 25b of the first and second drive transistors TD1 and TD2 is formed to be in contact with the $n^{++}$ impurity region 24. The portions of the semiconductor substrate 21 on both sides of the gate electrode 25a of the first access transistor TA1 are lightly doped with n type impurity ions to form the $n^-$ impurity regions 26 therein.

Referring to FIGS. 5b and 6b, an oxide or nitride film is deposited on the entire surface and etched back, to form sidewall insulating films 27 at both sides of the gate electrode 25a of the first access transistor TA1 and side of gate electrode 25b of the first drive transistor TD1. After removing portions of the gate oxide film 23 on both sides of the gate electrode 25a for the first access transistor TA1, a second gate oxide film 28 is formed on the entire surface. Then, a second polysilicon layer is deposited on the semiconductor substrate 21 and doped with n type impurities. The second polysilicon layer is subjected patterning by means of photolithography to form first and second PMOS gate electrodes 29a and 29b for use as voltage shifters that change voltage, covering a top of the n– impurity regions 26 on one side of the gate electrode 25a for the first access transistor TA1, and a top and a side of one side of the gate electrode 25b of the first drive transistor TD1, respectively. An n type impurity ions are injected into a portion of the semiconductor substrate 21 on one side of each of the gate electrodes 25a for the first and second access transistors TA1 and TA2 and the first and second PMOS gate electrodes 29a and 29b to form an N well 30 therein.

Referring to FIGS. 5c, 6c and 6d, a photoresist film is coated on the entire surface and patterned to open a portion of the N well 30, which is a center portion of a three equal division of the N well 30 formed in the active region on one side both of the gate electrode 25a of the first access transistor and the first PMOS gate electrode 29a. N type impurity ions are injected heavily into the opened region of the N well 30 with the patterned photoresist film used as a mask, to form an $N^+$ source/drain region 31, and the photoresist film is removed. In this instance, the gate electrodes 25a for the first and second access transistors and the first and second PMOS gate electrodes 29a and 29b are formed in the same direction with the other respectively, with their operations being in vertical directions from the other, respectively.

A photoresist film is coated again and patterned to open a portion of the photoresist film on one side of the $n^+$ source/ drain region 31 formed on the center part of the three divisional N well 30, into which opened portion p impurities are injected with the patterned photoresist film used as a mask to form a p impurity region 32 therein. With the same process, $p^+$ impurity ions are injected into the other side of the $n^+$ source/drain region 31 to form a $p^+$ impurity region 33. The p impurity region 32 and the $p^+$ impurity region 33 act as source/drain regions for the first and second PMOS gate electrodes 29a and 29b, respectively. The $n^-$ impurity regions 26 under the first and second PMOS gate electrodes 29a and 29b are used as channel regions for the first and second PMOS transistors 29a and 29b, respectively.

Referring to FIGS. 5d, 6d, 6e and 6f, an interlayer insulating film 34 is deposited on the entire surface and a contact hole is formed in each of the $n^+$ source/drain regions 31 on the other sides of the gate electrodes 25a for the first and second access transistors TA1 and TA2 and in each of the p impurity regions 32 formed in the N wells 30 on one sides of the gate electrodes 25a for the first and second access transistors. A third polysilicon layer is deposited on the entire surface and patterned to leave portions of the photoresist film on regions to be used as load resistors. The third polysilicon layer is doped with n type phosphorus with the patterned photoresist film as a mask, to use as an interlayer connection line. The portions used as the interlayer connection line connect the $n^+$ source/drain regions 31 on the other sides of the gate electrodes 25a for the first and second transistors to the p impurity regions 32 used as drains for the first and second PMOS transistors 29a and 29b respectively, to form P-N diodes. It is important to set doping concentrations of the phosphorus in the load polysilicon layer and doping concentrations in the drain p impurity regions 32 of the first and second PMOS transistors.

The operation of the SRAM cell of the present invention will be explained with reference to the attached drawing. Referring to FIG. 3, in an operation when a level of "1" is written on the first cell node CN1 of the SRAM cell, a voltage transmitted to the first cell node CN1 is in general can be expressed with an equation $V_{CN1}=V_{CC}-Vth'(TA1)$, where, Vth'(TA1) is a threshold voltage increased by a back bias effect of the first access transistor TA1. For example, when $V_{CC}=5$ V, the voltage was $V_{CN1}=5-1.5=3.5$ V in the related art. On the other hand, the voltage in the first cell node of the present invention is $V_{CN1}=5-0.7=4.3$ V. The back bias voltage Vth'(TA1) on the first access transistor is lowered to 0.7 by the cut-in voltage on the P-N+ diode connected to the first cell node CN1 and the p impurity regions 32 of the first PMOS transistor. Accordingly, a voltage of 4.3 V, higher than the related art voltage, can be maintained in the first cell node CN1.

The semiconductor memory device and the method for fabricating the same have various advantages. The availability of a higher voltage stored in the cell node in an writing operation owing to a cut-in voltage of the diode formed in the cell node and the PMOS transistor can improve the stability of an SRAM cell, with an improvement in an operation with a low source voltage $V_{CC}$, i.e., lower voltage operation characteristics.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A semiconductor memory device including a first access transistor, a second access transistor, a first drive transistor, a second drive transistor, a first load resistor, a second load resistor, a first cell node having a first terminal of the first access transistor, a gate terminal of the second drive transistor and the first load resistor connected thereto in common, and a second cell node having a first terminal of the second access transistor, a gate terminal of the first drive transistor and the second load resistor connected thereto in common, the semiconductor memory device comprising:
    a first voltage shifter connected to the first cell node and the second cell node for changing a voltage; and
    a second voltage shifter connected to the first cell node and the second cell node for changing a voltage.

2. A semiconductor memory device of claim 1, wherein the first, and second voltage shifters have a first MOS transistor and a second MOS transistor, respectively.

3. A semiconductor memory device of claim 2, wherein a gate for the first MOS transistor in the first voltage shifter is connected to the second cell node, and a gate for the second MOS transistor in the second voltage shifter is connected to the first cell node.

4. A semiconductor memory device of claim 1, further comprising a first rectifier connected between the first voltage shifter and the first cell node, and a second rectifier connected between the second voltage shifter and the second cell node.

5. A semiconductor memory device of claim 4, wherein each of the first, and second rectifiers is a diode.

6. A semiconductor memory device of claim 5, wherein the diodes are inversely positioned with respect to the first, and second cell nodes, respectively.

7. A semiconductor memory device including two access transistors, two drive transistors and two load resistors and voltage shifters each connected to one of the access transistors for changing a voltage, the semiconductor memory device comprising:
    gates for the access transistors formed on a substrate, and first and second impurity regions of the access transistors formed in portions of the substrate on both sides of the gates of the access transistors;
    a first impurity region, a channel region and a second impurity region of each of the voltage shifters formed in portions of the substrate along respective first, second and third sides of the first impurity regions of the access transistors, wherein the second impurity region of a corresponding access transistor also serves as a portion of the channel region of a corresponding voltage shifter; and,
    gates for the voltage shifters formed over the first impurity region of the access transistor serving as the portion of the channel regions of the voltage shifters.

8. The semiconductor memory device of claim 7, wherein each of the first and second impurity regions of the access transistors form one of source and drain regions of the access transistors.

9. The semiconductor memory device of claim 7, wherein the second impurity regions of the access transistors are positioned below, and extend longitudinally in a first direction parallel to, the gates for the voltage shifters and are in contact with the second side of the first impurity regions of the access transistors.

10. The semiconductor device of claim 7, wherein the second impurity regions of the access transistors are n– regions, and the first impurity regions of the access transistors are n+ regions.

11. The semiconductor device of claim 7, wherein the first and second impurity regions of the voltage shifters are doped with one of p impurities and p+ ions.

12. The semiconductor device of claim 7, wherein the first and second impurity regions of the voltage shifters form source and drain regions for the voltage shifter, respectively.

13. A memory device comprising:
    an access device that receives first and second data signals on first and second data lines, respectively, and coupled to first and second nodes;
    a drive device coupled to said access device at the first and second nodes; and
    a voltage shifting device coupled to said first and second nodes to change a voltage of at least one of said first and second nodes, said voltage shifting device comprising,
        a first voltage shifter coupled to the first node and the second node such that said first voltage shifter changes a first node voltage level; and
        a second voltage shifter coupled to the second node and the first node such that said second voltage shifter changes a second node voltage level.

14. The memory device of claim 13, wherein access device comprises:
    a first access transistor having a control electrode and first and second electrodes, the first electrode being coupled to the first data line, the second electrode being coupled to the first node and the control electrode being coupled for receiving a control signal; and
    a second access transistor having a control electrode and first and second electrodes, the first electrode being coupled to the second data line, the second electrode being coupled to the second node and the control electrode being coupled for receiving the control signal.

15. The memory device of claim 13, wherein said drive device comprises:
   a first resistive element coupled to the first node;
   a second resistive element coupled to the second node;
   a first drive transistor coupled to the first and second nodes; and
   a second drive transistor coupled to the first and second nodes.

16. The memory device of claim 14, wherein said first drive transistor includes a control electrode coupled to the second node, a first electrode coupled to the first node, and a second electrode for coupling with a first prescribed voltage.

17. The memory device of claim 14, wherein said second drive transistor includes a control electrode coupled to the first node, a first electrode coupled to the second node, and a second electrode for coupling with a first prescribed voltage.

18. The memory device of claim 15, wherein said first and second resistive elements are first and second resistors, respectively, each having first and second electrodes, the first electrode of said first resistor being coupled to said first node and the first electrode of said second resistor being coupled to said second node, said second electrodes of said first and second resistors being coupled for receiving a first prescribed voltage.

19. The memory device of claim 13, wherein said first voltage shifter comprises:

a first rectifier coupled to the first node; and
   a first transistor coupled to said first rectifier, the first data line and the second node.

20. The memory device of claim 19, wherein said first transistor comprises a control electrode coupled to the second node, a first electrode coupled to said first rectifier and a second electrode coupled to the first data line.

21. The memory device of claim 20, wherein said first rectifier includes a diode having a cathode and an anode, the cathode being coupled to the first node and the anode coupled to the first electrode.

22. The memory device of claim 21, wherein said first transistor is a PMOS transistor and said diode is a P-N junction diode.

23. The memory device of claim 13, wherein said second voltage shifter comprises:
   a second rectifier coupled to the second node; and
   a second transistor coupled to said second rectifier, the second data line and the first node.

24. The memory device of claim 23, wherein said second transistor comprises a control electrode coupled to the first node, a first electrode coupled to said second rectifier and a second electrode coupled to the second data line.

25. The memory device of claim 21, wherein said second rectifier includes a diode having a cathode and an anode, the cathode being coupled to the second node and the anode coupled to the first electrode.

26. The memory device of claim 22, wherein said second transistor is a PMOS transistor and said diode is a P-N junction diode.

* * * * *